(12) United States Patent
Matsumoto et al.

(10) Patent No.: US 12,006,568 B2
(45) Date of Patent: Jun. 11, 2024

(54) VAPOR DEPOSITION DEVICE

(71) Applicant: THERMALYTICA, INC., Tsukuba (JP)

(72) Inventors: Kazuhide Matsumoto, Tokyo (JP); Hsin-Tsai Wang, Taipei (TW)

(73) Assignee: THERMALYTICA, INC., Tsukuba (JP)

( * ) Notice: Subject to any disclaimer, the term of this patent is extended or adjusted under 35 U.S.C. 154(b) by 379 days.

(21) Appl. No.: 17/596,571

(22) PCT Filed: Mar. 18, 2020

(86) PCT No.: PCT/JP2020/011904
§ 371 (c)(1),
(2) Date: Dec. 13, 2021

(87) PCT Pub. No.: WO2021/186604
PCT Pub. Date: Sep. 23, 2021

(65) Prior Publication Data
US 2022/0228254 A1    Jul. 21, 2022

(51) Int. Cl.
*C23C 14/50* (2006.01)
*C23C 14/35* (2006.01)
*C23C 14/56* (2006.01)

(52) U.S. Cl.
CPC ............ *C23C 14/505* (2013.01); *C23C 14/35* (2013.01); *C23C 14/564* (2013.01)

(58) Field of Classification Search
CPC .................................................. C23C 14/505
See application file for complete search history.

(56) References Cited

U.S. PATENT DOCUMENTS

2004/0211363 A1\* 10/2004 Bruce .................. C23C 14/548
118/715
2013/0037407 A1\* 2/2013 Gresik .................. B65G 47/04
204/298.15

FOREIGN PATENT DOCUMENTS

| JP | H07-331447 A | 12/1995 |
|----|--------------|---------|
| JP | 2003-313652 A | 11/2003 |

(Continued)

OTHER PUBLICATIONS

International Search Report from International Patent Application No. PCT/JP2020/011904, dated Jun. 2, 2020.

*Primary Examiner* — Keath T Chen
(74) *Attorney, Agent, or Firm* — Potomac Law Group, PLLC

(57) ABSTRACT

A vapor deposition device for forming a ceramic coating on a substrate, the device including a coating chamber, loading chambers, substrate support mechanisms, horizontal moving mechanisms, and reversing mechanisms, and configured as follows. The coating chamber and each loading chambers are connected individually to a vacuumizer and are connected to each other at their openings. In the coating chamber, an electron gun is provided that emits an electron beam with which the held ceramic raw material is irradiated. Each of the substrate support mechanisms includes left and right partition walls, a left substrate support plate on the left side of the left partition wall, and a right substrate support plate on the right side of the right partition wall. Each of the substrate support plates has multiple substrate mounting portions for mounting substrates thereon. The left and right substrate support plates are capable of revolving in a plane parallel to the left and right partition walls, and each of the multiple substrate mounting portions is capable of rotating. Each of the horizontal moving mechanisms is configured to cause the substrate support mechanism to move horizontally (Continued)

in the left-right direction between a vapor deposition position where one of the partition walls is in close contact with the opening and a reverse position where the left and right sides of the substrate support mechanism are reversed.

7 Claims, 11 Drawing Sheets

(56) References Cited

FOREIGN PATENT DOCUMENTS

| | | |
|---|---|---|
| JP | 2005-187114 A | 7/2005 |
| JP | 2006-299378 A | 11/2006 |
| JP | 2008-240105 A | 10/2008 |
| JP | 2010-095745 A | 4/2010 |
| JP | 2012-224878 A | 11/2012 |
| JP | 2015-063723 A | 4/2015 |

* cited by examiner

Fig. 1
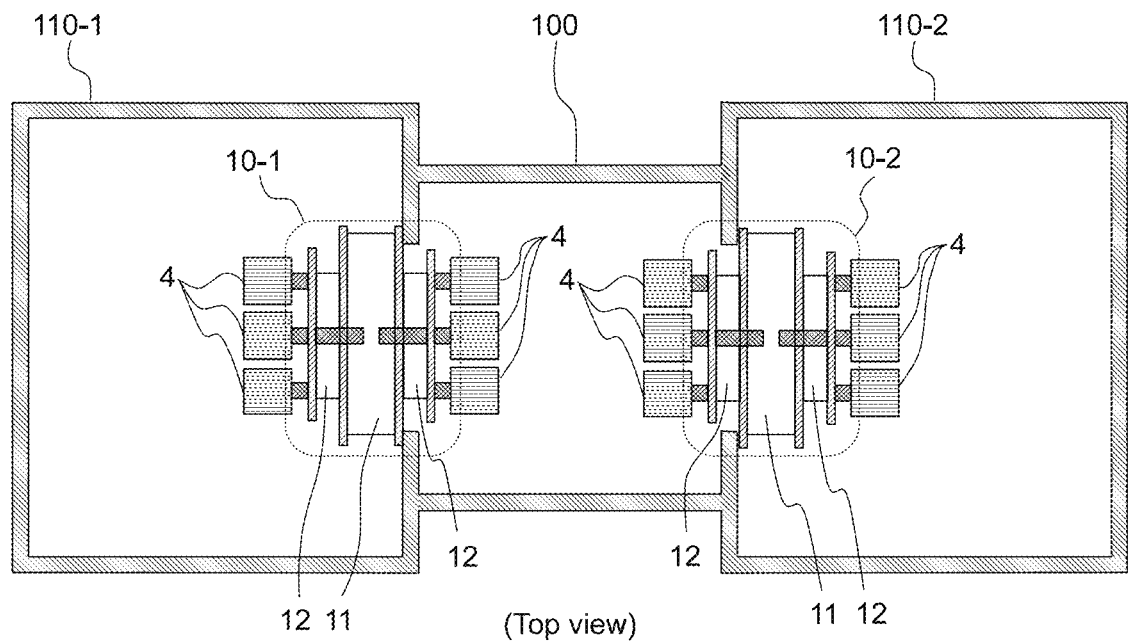
(Top view)
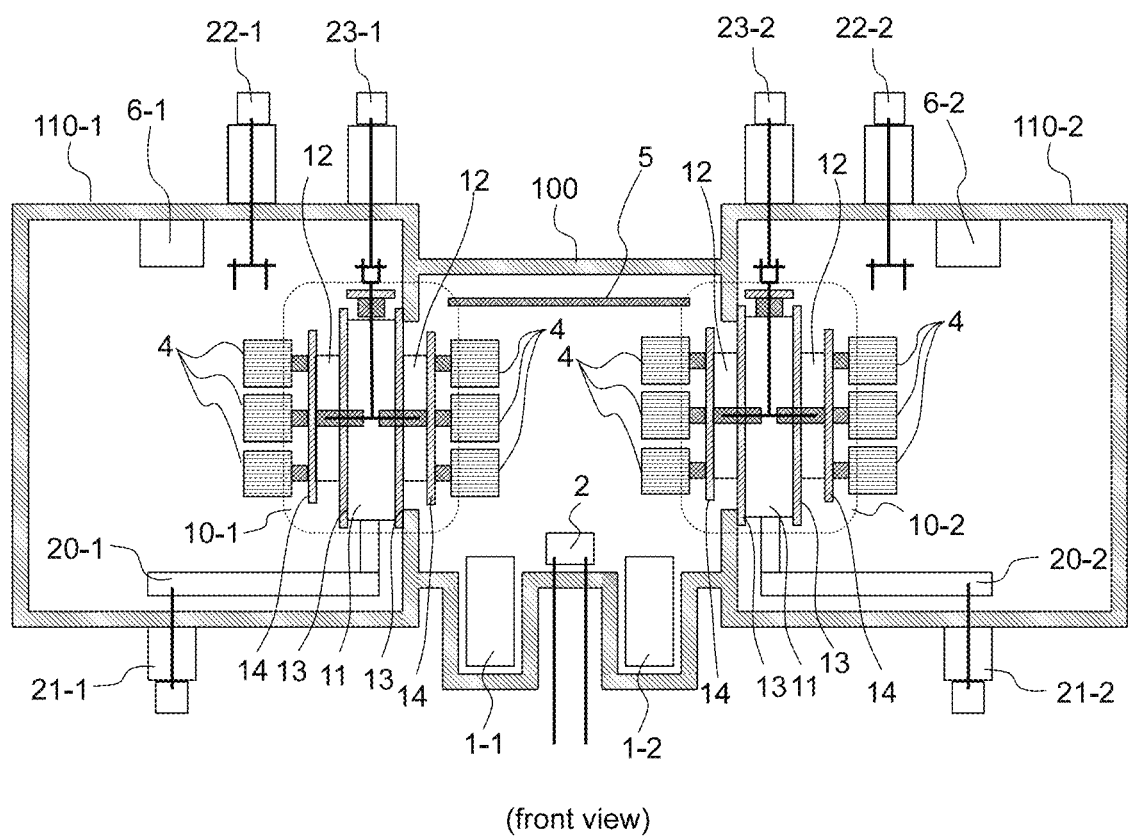
(front view)

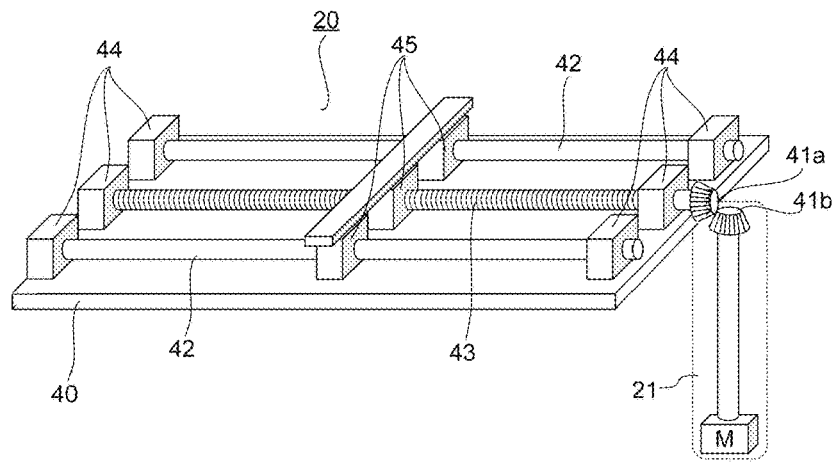
Fig. 4
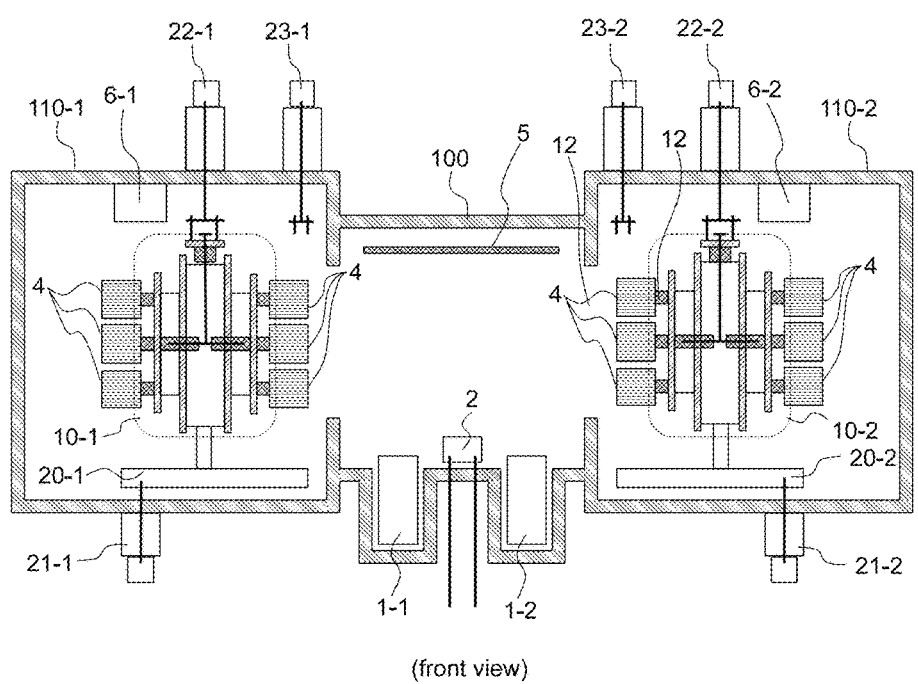
Fig. 5 (front view)
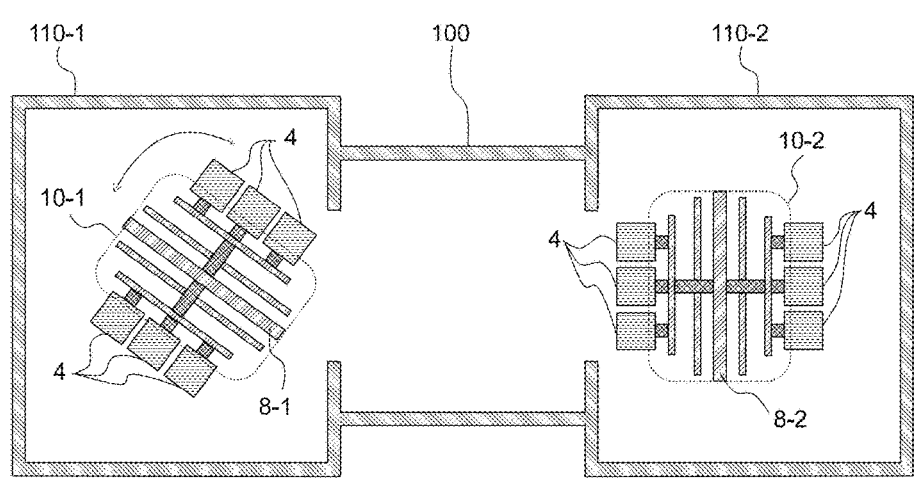
Fig. 6 (Top view)

(side view of the coating chamber)

(side view of the loading chamber)

| Preparation Camber 110 | cleaning | sputtering | | cleaning | sputtering | | | |
|---|---|---|---|---|---|---|---|---|
| Coating Camber 100 | | | | | coating | | coating | |
| | t1 | t2 | t3 | t4 | t5 | t6 | t7 | t8 |

Fig. 20
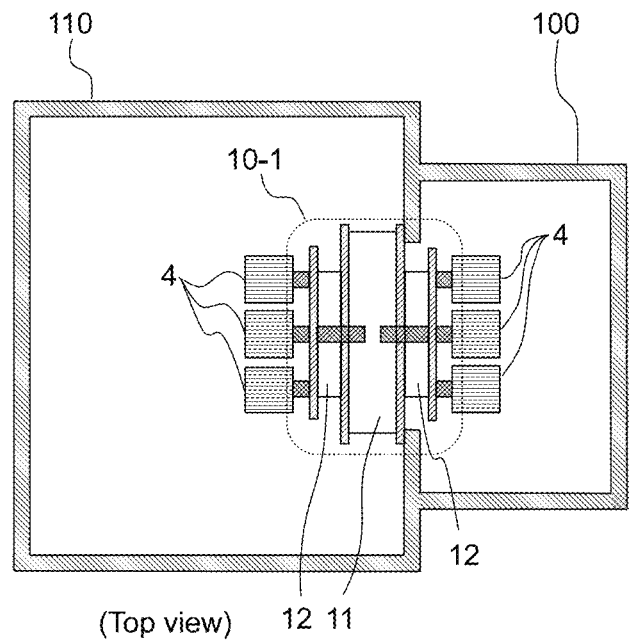
(Top view)
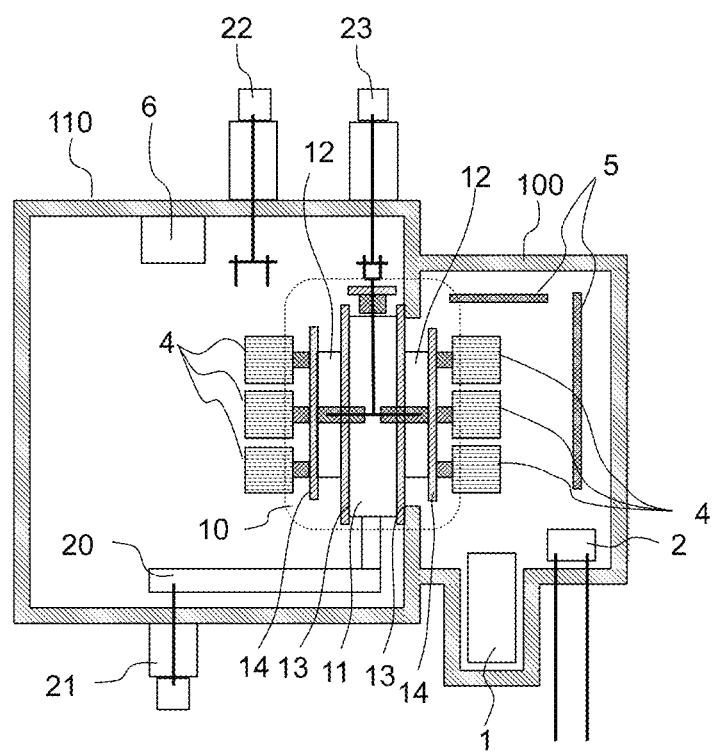
(front view)

(Top view)

VAPOR DEPOSITION DEVICE

TECHNICAL FIELD

The present invention relates to vapor deposition device especially suitable for vapor-depositing ceramic on a metal substrate surface.

BACKGROUND ART

Metal substrates operating at elevated temperatures, such as rotor blades and stationary blades of a gas turbine, and blades of a combustor or a jet engine, are required to be coated with thermal barrier ceramic coatings. However, due to a difference in thermal expansion coefficient between the metal of the substrates and the coated ceramic caused by heat cycle applied to the substrates, the coating may crack or spall resulting in impairing durability. To address the issue of durability impairment, various techniques have been proposed.

PTL 1 discloses a technique of layering a bond layer and thermal barrier ceramic coating on a metal substrate. The bond layer is regarded as providing corrosion resistance and oxidation resistance to the metal substrate, improving adhesiveness between the metal substrate and the ceramic coating, and relaxing the difference in thermal expansion between the metal substrate and the ceramic coating to relieve thermal stress. PTL 1 also discloses electron-beam vapor deposition device provided with a loader for rotatably holding a metal substrate. Electron-beam vapor deposition is regarded as forming especially hard columnar crystallites densely (paragraph 38 of PTL 1). Electron-beam vapor deposition is a type of physical vapor deposition in which a ceramic raw material placed in a crucible is heated, melted and evaporated by electron-beam irradiation, and the generated vapor is deposited on a metal substrate.

PTL 2 discloses heat treatment/vapor deposition composite device capable of conducting vapor deposition and heat treatment consecutively in the same chamber. The composite device includes a rotating jig capable of rotating a substrate on two axes: rotation and revolution. The shaft of the rotating jig is hollow so that a thermocouple can be inserted therein, so the temperature of the substrate can be controlled precisely.

PTL 3 discloses a workpiece moving mechanism for vapor deposition device capable of conducting vapor deposition on a large number of workpieces at a time. Multiple workpieces are moved while being rotated along a certain revolution path including a vapor deposition position from a target. Although a vapor deposition target may be referred to as a "work" or a "workpiece", the term "substrate" is used herein. These terms are the same in meaning.

PRIOR ART DOCUMENT

Patent Document

PTL 1: Japanese Patent Application Laid-Open No. 2003-313652
PTL 2: Japanese Patent Application Laid-Open No. 2006-299378
PTL 3: Japanese Patent Application Laid-Open No. 2012-224878

SUMMARY OF THE INVENTION

Problems to be Solved by the Invention

The inventors have studied and developed vapor deposition device with improved mass productivity in thermal barrier ceramic coating on metal substrates as those disclosed in PTL 1 and PTL 2. Improvement in mass productivity may be achieved by conducting vapor deposition on a large number of substrates at a time. This may be realized by incorporating the technique disclosed in PTL 3 into those disclosed in PTL 1 and PTL 2.

The inventors, however, have found that the technique disclosed in PTL 3 cannot be applied to thermal barrier ceramic coating on metal substrates. The workpiece moving mechanism disclosed in PTL 3 is disposed between two rectangular targets standing on the left and right sides, and a power supply for excitation is connected to each target (see paragraph 14, FIGS. 1 and 2 of PTL 3). In thermal barrier ceramic coating on a metal substrate, since electron-beam vapor deposition is suitable for making the thermal barrier ceramic coating hard and dense columnar crystallites, it is necessary to place the metal substrate, the workpiece, above the crucible containing the ceramic raw material to be heated and melted by the electron beam. In the vapor deposition device disclosed in PTL 3, if a crucible to be irradiated with an electron beam is disposed instead of a target, the thickness of coating formed on the workpiece may vary significantly between positions near and far from the crucible. Therefore, such a configuration cannot be practically adopted.

An objective of the present invention is to provide vapor deposition device suitable for mass production with little variations in coating thickness on multiple substrates even in electron-beam vapor deposition.

Means for accomplishing the objective above will be described below. Other objectives and novel features will become obvious from the description of the specification and the accompanying drawings.

Means for Solving the Problem

An aspect of the present invention is as follows.

An aspect of the invention is vapor deposition device for forming ceramic coating on substrates. The device includes a coating chamber, one or more loading chambers, one or more substrate support mechanisms, one or more horizontal moving mechanisms, and one or more reversing mechanisms, and is configured as follows.

The coating chamber and each of the loading chambers are connected individually to a vacuumizer and are connected to each other at their openings. In the coating chamber, an electron gun is provided that emits an electron beam with which the held ceramic raw material is irradiated. Each of the substrate support mechanisms includes left and right partition walls, a left substrate support plate on the left side of the left partition wall, and a right substrate support plate on the right side of the right partition wall. Each of the substrate support plates has multiple substrate mounting portions for mounting substrates thereon. The left and right substrate support plates are capable of revolving in a plane parallel to the left and right partition walls, and each of the multiple substrate mounting portions is capable of rotating. Each of horizontal moving mechanisms is capable of moving the substrate support mechanism horizontally in the left-right direction between a vapor deposition position where one of the partition walls is in close contact with the wall surface around the opening and a reverse position where the left and right sides of the substrate support mechanisms are reversed.

Effect of the Invention

The effect to be obtained by the above aspect will be briefly described.

That is, it is possible to provide vapor deposition device suitable for mass production with little variations in coating thickness on multiple substrates even if ceramic vapor deposition is to be conducted on multiple substrates by electron beam. According to the above aspect, electron-beam vapor deposition can be adopted since vapor deposition can be conducted with the substrate placed above the ceramic evaporation source. In addition, since the multiple substrates are rotated and revolved while being held by the left and right substrate support plates, coating thickness can be easily controlled to be uniform. Further, since the left and right sides can be changed in the loading chamber, the substrates as vapor deposition targets can be changed without devacuumization, which improves mass productivity.

BRIEF DESCRIPTION OF THE DRAWINGS

FIG. 1 is a plan view illustrating a configuration example of vapor deposition device according to an embodiment of the invention.

FIG. 4 is a schematic view illustrating a configuration example of a horizontal moving mechanism for substrates.

FIG. 5 is a front view of the device with the substrate support mechanism moved to a reverse position.

FIG. 6 is a top view of the device at the reverse position.

FIG. 20 is a configuration example of vapor deposition device provided with one loading chamber.

DETAILED DESCRIPTION OF THE INVENTION

1. Outline of Embodiment

Figure 2:
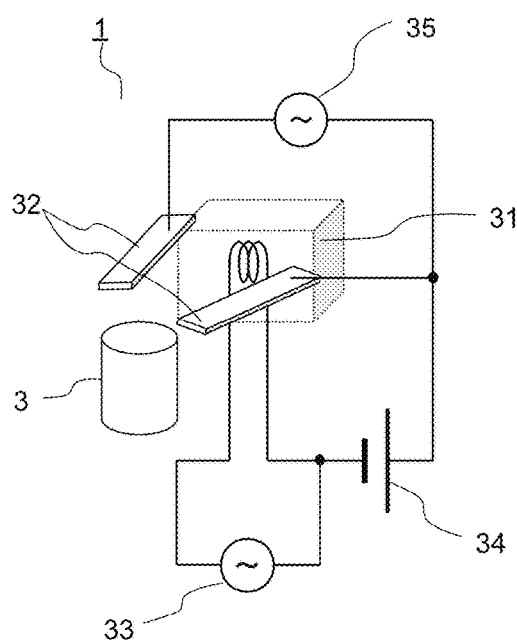
FIG. 2 is an explanatory diagram illustrating a configuration example of an evaporation source.

First, an outline of a typical embodiment disclosed herein will be described. Reference signs used in the drawings and referred to in parentheses in the outline of the typical embodiment merely exemplify those included in the concept of the components to which the reference signs are given. The branch numbers of the reference signs (e.g., hyphened numbers, "L" and "R") are given for the distinction of multiple same structures. If such distinction is unnecessary, reference signs without branch numbers are used as general numbers.

[1]<Vapor Deposition Device for Ceramic Coating Having Substrate Support Mechanism with Two Sets of Reversible Support Plates Supporting Multiple Substrates to be Rotated and Revolved>

A typical embodiment of the invention is vapor deposition device for forming ceramic coating on a substrate (4) and includes a coating chamber (100), a loading chamber (110-1, 110-2), a substrate support mechanism (10), a horizontal moving mechanism (20), and a reversing mechanism (22). The vapor deposition device is configured as follows (FIG. 1).

The coating chamber and the loading chamber are connected individually to a vacuumizer and are connected to each other at their openings in the left-right direction.

Inside the coating chamber, a raw material holder that supports the ceramic raw material (3) and an electron gun (31) that irradiates the ceramic raw material with an electron beam are provided (see FIG. 2, and 1-1, 1-2 in FIG. 1).

The substrate support mechanism (see FIG. 3, and 10-1, 10-2 in FIG. 1) has a left partition wall (13L, 13 in FIG. 1) and a right partition wall (13R, 13 in FIG. 1). On the left side of the left partition wall, a left substrate support plate (14L) on which multiple substrates (4 in FIG. 1) are mountable is provided. On the right side of the right partition wall, a right substrate support plate (14R) on which multiple substrates are mountable is provided. The substrate support mechanism can cause the left substrate support plate to rotate (revolve) in a plane parallel to the left partition wall, cause the mounted multiple substrates to rotate (rotate) around a mounting portion (15L), and cause the right substrate support plate to rotate in a plane parallel to the right partition wall.

A horizontal moving mechanism (see FIG. 4, and 20-1, 20-2 in FIG. 1) can cause the substrate support mechanism to move horizontally in the left-right direction between a vapor deposition position (FIG. 1) at which one of the left and right partition walls (13) is in close contact with a wall surface around the opening and a reverse position. The reversing mechanism can reverse the left and right sides of the substrate support mechanism at the reverse position (FIGS. 5 and 6).

With this configuration, it is possible to provide vapor deposition device suitable for mass production with little variations in coating thickness on multiple substrates even if ceramic vapor deposition is to be conducted on multiple substrates by electron beam. According to the above aspect, electron-beam vapor deposition can be adopted since vapor deposition can be conducted with the substrates placed above the ceramic evaporation source. In addition, since the multiple substrates are rotated and revolved while being mounted on the left and right substrate support plates, coating thickness can be easily controlled to be uniform. Further, since the left and right sides can be changed in the loading chamber, the substrates as vapor deposition targets can be changed without devacuumization, which improves mass productivity.

[2]<Pretreatment in Loading Chamber>

Figures 11, 12:
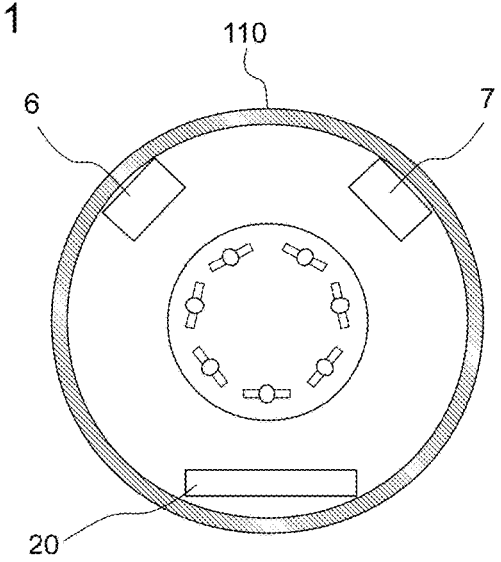
FIG. 11 is a side view illustrating a configuration example of a loading chamber.
FIG. 12 is a time chart when a vapor deposition treatment in the coating chamber is conducted immediately after a pretreatment in the loading chamber.

In the vapor deposition device of [1], the loading chamber further includes at least one of a sputtering source (6), a cleaner (7), and an oxidizer (not illustrated) (FIG. 11).

Thus, various pretreatments can be conducted in the loading chamber. For example, a substrate surface can be cleaned and slightly oxidized, or a bond layer can be formed by sputtering.

[3]<Supplement of Oxygen to Evaporation Source>

In the vapor deposition device of [1], the coating chamber further includes an oxygen plasma generator (2) (FIG. 1).

With the oxygen plasma generator (2), oxygen lost in the vapor generated by the electron gun can be supplemented. Since the ceramic raw material is an oxide, when the vapor generated from the oxide collides with high-energy thermions, the collision impact may decouple oxygen from a part of the oxide. As a result, there arises a problem that the element ratio in the deposited ceramic coating becomes different from an original composition ratio of ceramic. By generating oxygen plasma at a position near the ceramic evaporation source (1), the lost oxygen can be supplemented so that the composition ratio of the ceramic coating may be returned to the original ratio.

[4]<Electron-Beam Scanning Type Electron Gun>

In the vapor deposition device of [1], the coating chamber further includes a scanning mechanism (32, 35) for scanning a position where the ceramic raw material held in the raw material holder is irradiated with the electron beam (FIG. 2).

With the scanning mechanism (32, 35), the area to be irradiated with the electron beam is expanded from a point to a plane, reducing unbalanced in-plane consumption of the ceramic raw material (3). Instead of or in addition to this, the position irradiated with the electron beam may be moved by, for example, rotating the ingot as the ceramic raw material so that uniform in-plane consumption of the ceramic raw material may be facilitated.

[5]<Rotating/Revolving Mechanism for Substrates>

Figure 3:
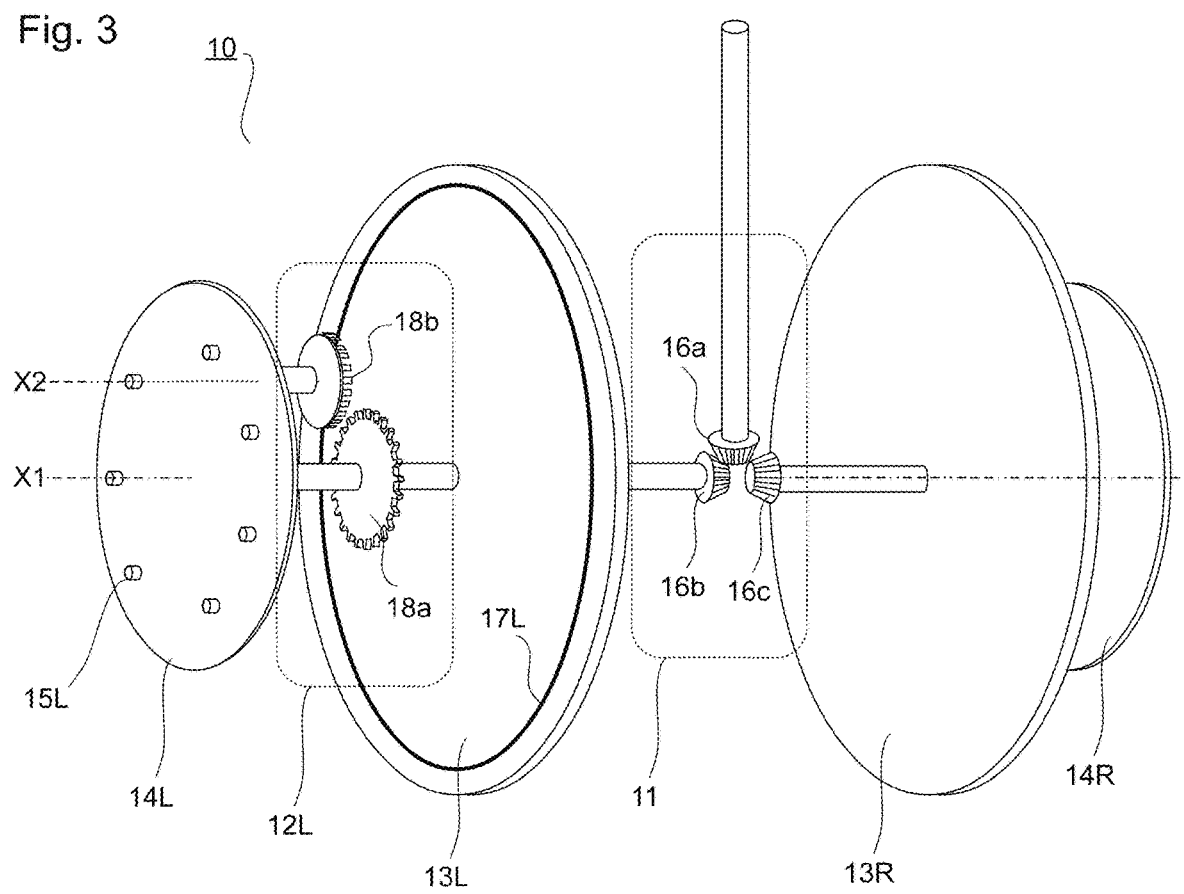
FIG. 3 is a schematic view illustrating a configuration example of a substrate support mechanism.

In the vapor deposition device of [1], the substrate support mechanism has gears (18a and 18b) that define the ratio between the rotational speeds of the left and right substrate support plates and the rotational speeds of the multiple substrates (FIG. 3).

The gears (18a, 18b) can be changed to adjust the rotational ratio of the rotation and the revolution. A rotating/revolving mechanism (12) for substrates may be provided with a speed change mechanism capable of changing the gear ratio.

[6]<Ingot Supply Mechanism>

Figure 13:
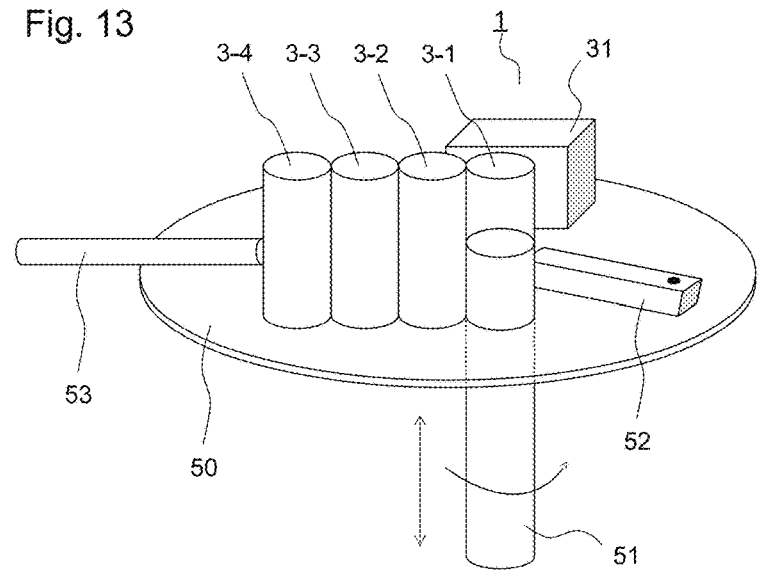
FIG. 13 is a perspective view illustrating a configuration example of a continuous supply mechanism of ingots as ceramic raw materials.
Figure 14:
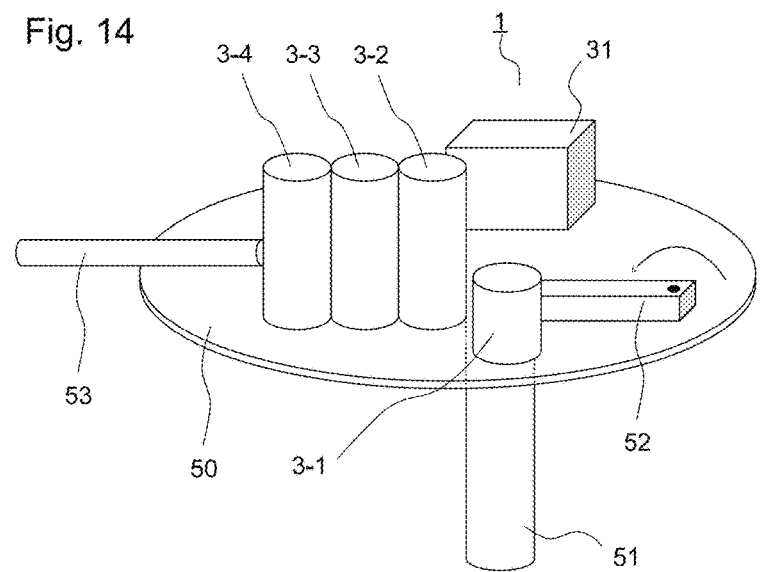
FIG. 14 is an explanatory diagram illustrating removal of a used ingot from an electron-beam irradiation point in the continuous supply mechanism of FIG. 13.
Figure 15:
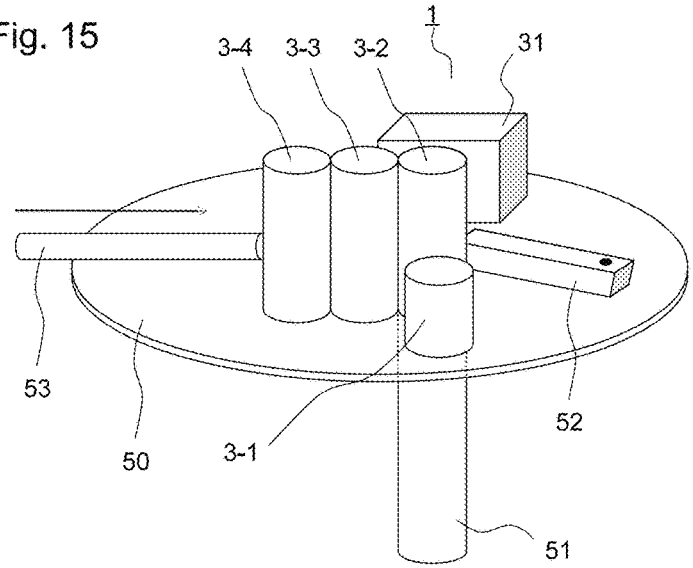
FIG. 15 is an explanatory diagram illustrating movement of an unused ingot to an electron-beam irradiation point in the continuous supply mechanism of FIG. 13.

In the vapor deposition device of [1], the raw material holder is capable of holding multiple ceramic ingots (3-1 to 3-4) and includes a mechanism for sequentially moving the multiple ceramic ingots to the position where they are to be irradiated with the electron beam (FIGS. 13, 14 and 15).

With the mechanism, vapor deposition can be conducted without interruption for the supplement or replacement of the ingot as the ceramic raw material. In addition, waste of the ingot as the ceramic raw material may be reduced.

[7]<Multiple Substrate Support Mechanisms and Loading Chambers>

Figure 21:
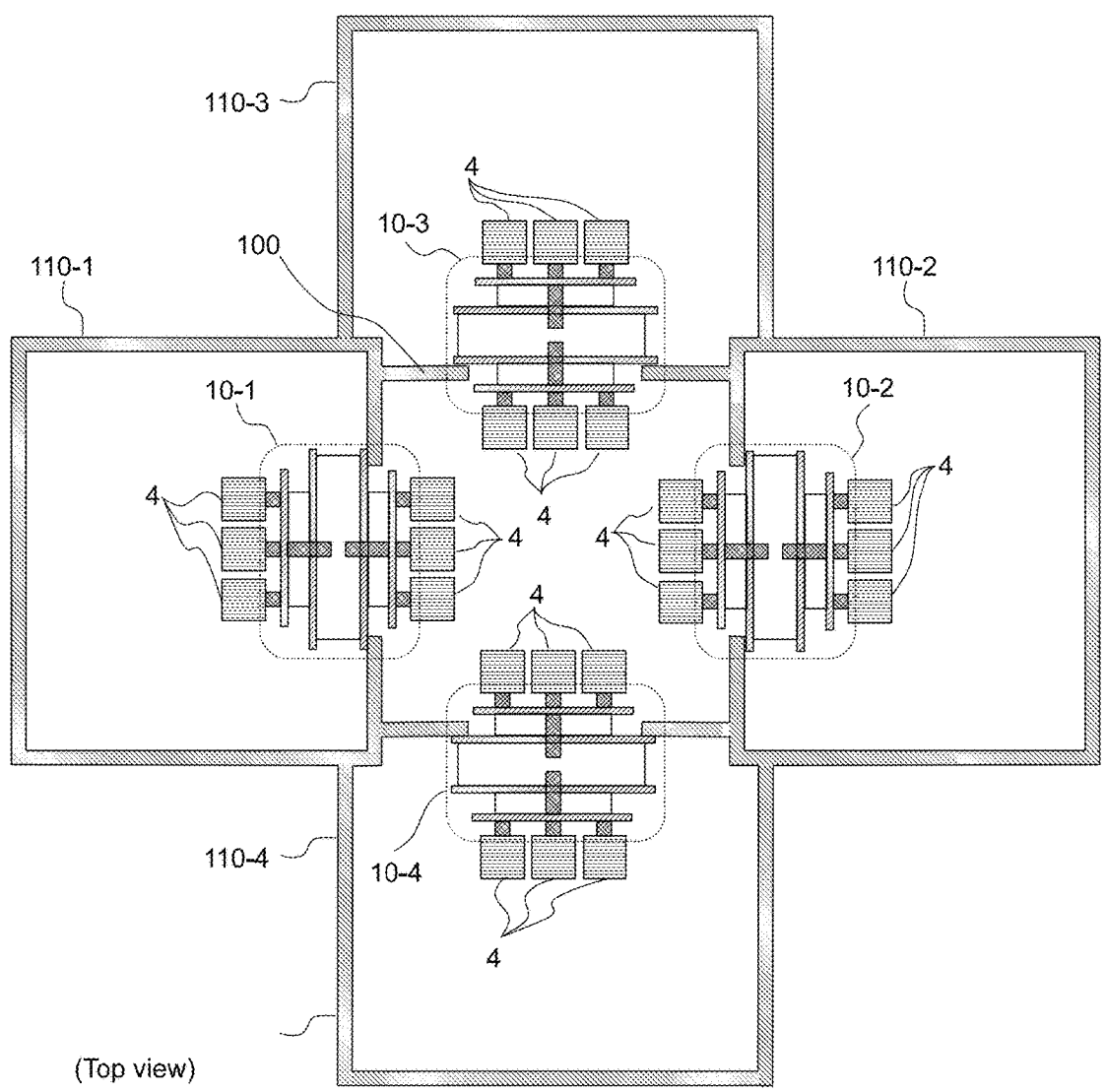
FIG. 21 is a configuration example of vapor deposition device provided with four loading chambers.

In the vapor deposition device of [1], multiple sets of the loading chambers, the substrate support mechanisms, the horizontal moving mechanisms, and the reversing mechanisms are provided at symmetrical positions about the coating chamber (FIGS. 1 and 21).

Therefore, the number of substrates subject to vapor deposition at a time can be doubled, further improving mass productivity.

2. Details of the Embodiments

The embodiments will be described in more detail.

First Embodiment

FIG. 1 is a plan view illustrating a configuration example of vapor deposition device according to an embodiment of the present invention. The upper half of the drawing is a top view and the lower half is a front view, both of which are cross-sectional views of a central part of the device illustrating an internal structure of the device. To facilitate understanding of the invention, illustration of some of the structures is omitted, simplified, or moved from their original positions.

Although not particularly limited, examples are given regarding a substrate, a ceramic raw material, and a bond layer. The substrate is, for example, a heat-resistant superalloy such as an Ni-based alloy, a Co-based alloy, or an Fe-based alloy. The ceramic raw material, i.e., the material of the ceramic coating, may be, for example, mainly zirconium oxide (zirconia; $ZrO_2$) and hafnium oxide (hafnia; $HfO_2$) to which $Y_2O_3$, MgO, CaO, $TiO_2$, lanthanoid oxide, etc., may be added as a stabilizer. The ceramic raw material is generally supplied as ingots. Hereinafter, the term "ingot" refers to an ingot as a ceramic raw material. The bond layer is composed of, for example, platinum (Pt) group metals, or any of an Ni-based alloy, a Co-based alloy, and an Ni—Co alloy, and is a heat-resistant alloy represented by a general formula M-Cr—Al—Y (where M is Ni, Co or Fe).

The vapor deposition device of the first embodiment includes a coating chamber 100, left and right loading chambers 110-1 and 110-2, left and right substrate support mechanisms 10-1 and 10-2 on which multiple substrates 4 are to be mounted, horizontal moving mechanisms 20-1 and 20-2 and reversing mechanisms 22-1 and 22-2. The coating chamber 100 and the left and right loading chambers 110-1 and 110-2 are connected individually to a vacuumizer and are connected to each other at their openings. The vacuumizer is configured by appropriately combining a diffusion pump, a cryopump, a turbomolecular pump, a mechanical pump, a rotary pump, etc.

Inside the coating chamber 100, left and right evaporation sources 1-1 and 1-2 and a heater 5 are provided. The left and right evaporation sources 1-1 and 1-2 each include a raw material holder that supports a ceramic raw material 3, and an electron gun 31 that produces an electron beam with which the ceramic raw material 3 is to be irradiated. The heater 5 is for heating the substrates 4 and to which power is supplied through a power cable (not illustrated).

FIG. 2 is an explanatory diagram illustrating a configuration example of an evaporation source. The ingot as the ceramic raw material 3 held in the raw material holder (not illustrated) is irradiated with an electron beam to be heated and melted to vaporize, and the vapor is deposited on the surfaces of the substrates 4. The electron gun 31 is connected to a power supply 33 that generates thermions and to a DC high-voltage power supply 34 that accelerates the generated thermions. These power supplies are individually introduced from outside of the coating chamber 100 using cables (not illustrated).

It is more desirable that the evaporation source 1 further includes a scanning mechanism that scans the position irradiated with the electron beam. The scanning mechanism can be configured by using, for example, two electrodes disposed above the ceramic raw material 3 and an AC power supply 35 that alternates the potential difference between the two electrodes. The median of the acceleration energy given to the thermions is defined by the voltage of the power supply 34. The lateral electric field generated by the AC power supply 35 between the two electrodes is made to scan between the two electrodes. In this manner, the position where the electron beam is irradiated expands from a point to a plane, reducing unbalanced consumption in the area of the ceramic raw material 3. Further, by moving the ceramic raw material 3 instead of scanning the ceramic raw material 3 with the electron beam, unbalanced consumption in the area of the raw material can be reduced. For example, the ingot as the ceramic raw material 3 is rotated. By scanning with the electron beam and by rotating the ingot at the same time, the more uniform in-plane consumption of the ceramic raw material 3 can be achieved. It is also possible to use a greater number of electrodes and power supplies for the scanning with the electron beam to realize two-dimensional scanning.

Now we return to the description with reference to FIG. 1. It is more desirable that the coating chamber 100 further includes an oxygen plasma generator 2. Since the ceramic raw material is an oxide, when the generated vapor collides with high-energy thermions, the collision impact may decouple oxygen from a part of the oxide. As a result, there arises a problem that the composition ratio of elements of the deposited ceramic coating becomes different from an original composition ratio of ceramic. For example, when the ceramic raw material is zirconium oxide $ZrO_2$, oxygen is decoupled from a part thereof to become ZrO. Then, the ratio of oxygen O to zirconium Zr=1 in the deposited ceramic may become lower than an original value of 2. By providing the oxygen plasma generator 2 near the evaporation source 1 for generating oxygen plasma, the lost oxygen can be supplemented. The oxygen plasma generator 2 generates oxygen plasma when, for example, oxygen gas and radio power are supplied from outside and the introduced oxygen is excited with a high frequency. Oxygen ions in the plasma bond with the vapor from which oxygen is decoupled to get the original element ratio. Oxygen to be introduced into may, for example, desirably be 1 to 10 Pa ($10^{-2}$ to $10^{-1}$ Torr) when the residual gas amount is $10^{-3}$ Pa ($10^{-5}$ Torr).

The substrate support mechanism 10 will be described. FIG. 1 illustrates a configuration example including two, left and right substrate support mechanisms 10-1 and 10-2. Multiple substrates 4 can be mounted on each of the left and right substrate support mechanisms 10. The substrate support mechanism 10 is configured to both rotate the substrates 4 and revolve the substrates 4 on each side at the same time. Driving force for rotation and revolution is supplied from outside of the loading chamber 110-1, 110-2 by, for example, a rotation/revolution driving mechanism 23-1, 23-2 for substrates. When the substrates 4 on one side enter the coating chamber 100, the substrates 4 on the other side stay in the loading chamber 110-1, 110-2. Once vapor deposition is completed, the substrate support mechanism 10 is reversed to change the left and right sides. In order to reverse the substrate support mechanism 10, the horizontal moving mechanism 20-1, 20-2 for substrates separates the substrate support mechanism 10 from a wall surface at the boundary of the coating chamber 100, and then reverses the substrate support mechanism 10 by the driving force supplied from a reverse driving mechanism 22-1, 22-2 for substrates. The driving force to the horizontal moving mechanism 20-1, 20-2 for substrates is supplied from a horizontal movement driving mechanism 21-1, 21-2 for substrates. Hereinafter, this will be described in more detail.

FIG. 3 is a schematic view illustrating a configuration example of a substrate support mechanism 10. To facilitate understanding, the distance between the components is increased in the left-right direction in FIG. 3. The substrate support mechanism 10 has a rotational power transmission mechanism 11 for substrates at the center thereof, the left and right partition walls 13L and 13R, the rotating/revolving mechanisms 12L and 12R for substrates, and the substrate support plates 14L and 14R in this order outside the rotational power transmission mechanism 11 for substrates. Multiple substrate mounting portions 15L and 15R are provided on the substrate support plates 14L and 14R, respectively.

The rotational power transmission mechanism 11 for substrates transmits the driving force for rotation and revolution supplied from the rotation/revolution driving mechanism 23 for substrates to the rotating/revolving mechanism 12L, 12R for substrates via the bevel gears 16a, 16b and 16c. The rotating/revolving mechanism 12L, 12R for substrates rotates (revolves) the substrate support plate 14L, 14R and transmits the driving force to the substrate mounting portion 15L, 15R via the gears 18a, 18b to rotate the same. Each of multiple substrate mounting portions 15L has a single gear 18b, but only one gear 18b is illustrated and others are not illustrated in FIG. 3.

When vapor deposition is conducted, the left and right partition walls 13L and 13R each are brought into close contact with the wall shared by the loading chamber and the coating chamber 100. An O-ring 17L, 17R is attached to the contact surface between the coating chamber 100 and the loading chamber to vacuum-seal the opening. The substrate support plate 14L, 14R and the rotating/revolving mechanism 12L, 12R for substrates are smaller than the opening, and the O-ring 17L, 17R is larger than the opening and is disposed at a position to be brought into close contact with the wall shared by the loading chamber and the coating chamber 100.

Now we return to the description with reference to FIG. 1. The left and right substrate support mechanisms 10-1 and 10-2 are configured to move horizontally in the left-right direction by the horizontal moving mechanisms 20-1 and 20-2. In order to conduct vapor deposition, the left and right substrate support mechanisms 10-1 and 10-2 are moved toward the coating chamber 100, and the left and right partition walls 13 are brought into close contact with the wall shared by the coating chamber 100 and the loading chambers 110-1 and 110-2 to vacuum-seal the openings. Usually, the loading chambers 110-1 and 110-2 are also evacuated during vapor deposition, so there is no pressure difference between the loading chamber 110-1, 110-2 and the coating chamber 100. Therefore, no tight vacuum sealing of the opening is required. However, if the loading chamber 110-1, 110-2 is configured to be open to the atmosphere even during vapor deposition, the device may become even more versatile. During vapor deposition, the rotation/revolution driving mechanisms 23-1 and 23-2 for substrates are coupled to the rotational power transmission mechanism 11 for substrates of the substrate support mechanisms 10-1 and 10-2, respectively, to supply driving force for rotating and revolving the substrates from outside of the coating chamber 100. The rotation/revolution driving mechanism 23-1 for substrates and the rotational power transmission mechanism 11 for substrates may be coupled in a manner that, for example, one of them is formed as two cylinders (rods) to fit into the other as two holes having a diameter larger than those of the cylinders.

In order to eject the substrates after the vapor deposition and put the substrates held in the loading chambers 110-1, 110-2 into the coating chamber 100, the substrate support mechanisms 10-1 and 10-2 are reversed in the left-right direction. For that purpose, it is necessary to provide a space for separating each of the left and right partition walls 13 from the wall shared by loading chamber 110-1, 110-2 and the coating chamber 100 and reversing the substrate support mechanisms 10-1 and 10-2. Therefore, the substrate support mechanisms 10-1 and 10-2 are moved to the position near the center of the loading chambers 110-1 and 110-2 by the horizontal moving mechanisms 20-1 and 20-2 for substrates.

FIG. 4 is a schematic view illustrating a configuration example of the horizontal moving mechanism 20 for substrates. The horizontal moving mechanism 20 for substrates is for horizontally moving the substrate support mechanism 10 by the horizontal movement driving mechanism 21 for substrates using driving force supplied from outside of the loading chambers 110-1 and 110-2. The horizontal moving mechanism 20 for substrates includes, for example, two guide rails 42 and a screw rod 43, three moving blocks 45, and two bevel gears 41a and 41b. The two guide rails 42 and a screw rod 43 are supported by six fixing blocks 44 fixed along two sides of a pedestal 40. The three moving blocks 45 supports the central portions of the guide rails 42 and the screw rod 43 and are connected to the substrate support mechanism 10. The two bevel gears 41a and 41b are coupled to the screw rod 43 and the horizontal movement driving mechanism 21 for substrates, respectively. Although not illustrated, the three moving blocks 45 and the substrate support mechanism 10 are connected in a rotatable state so that the left and right sides of the substrate support mechanism 10 can be changed horizontally. The two guide rails 42 are fixed to the two fixing blocks 44 at both ends, while the central moving block 45 is movable along the guide rails 42, penetrating the same, as it is not fixed to the guide rails 42. The screw rod 43 is rotatably supported by the fixing blocks 44 at both ends. The central moving block 45 is screwed to mesh with the screw thread of the screw rod 43 to be movable in the horizontal direction as the rotation of the screw rod 43. The driving force supplied as rotational force by the horizontal movement driving mechanism 21 for substrates is transmitted to the rotation of the screw rod 43 via the two bevel gears 41b and 41a, and is converted into force to horizontally move the moving block 45 located in the middle of the screw rod 43. The moving block 45 is coupled to the substrate support mechanism 10 together with the other two moving blocks 45 supported by the guide rails 42, and moves the substrate support mechanism 10 horizontally in the left-right direction. Teflon resin packing, for example, may be disposed at portions where the guide rails 42 and the moving blocks 45 are in contact with each other and portions of the fixing block 44 rotatably supporting the screw rods 43 in order to reduce friction. With the horizontal moving mechanism 20 for substrates, the substrate support mechanism 10-1, 10-2 can be horizontally in the left-right direction between the vapor deposition position and the reverse position. At the vapor deposition position, one of the left and right partition walls 13 is brought into close contact with the opening between the coating chamber 100 and the loading chamber 110-1, 110-2. At the reverse position, the left and right sides of the substrate support mechanism 10-1, 10-2 are reversed.

FIG. 5 is a front view of the device when the substrate support mechanism 10-1, 10-2 is moved to the reverse position. FIG. 6 is a top view of the device at the reverse position. FIG. 1 illustrates a state in which the substrate support mechanisms 10-1 and 10-2 are in their vapor deposition positions. As illustrated in the front view in the lower half of FIG. 1, the rotation/revolution driving mechanisms 23-1 and 23-2 for substrates are coupled to the substrate support mechanisms 10-1 and 10-2, respectively, and driving force for rotating and revolving the substrate is supplied from outside of the coating chamber 100. At the reverse position, the reverse driving mechanisms 22-1 and 22-2 for substrates are coupled to the substrate support mechanisms 10-1 and 10-2, respectively, and then the left and right sides of the substrate support mechanisms 10-1 and 10-2 are reversed. FIG. 6 illustrates a state in which the substrate support mechanism 10-1 is being reversed in the left loading chamber 110-1, and in the right loading chamber 110-2, the substrate support mechanism 10-2 is to be reversed or has already been reversed. In an actual operation, the left and right sides can be reversed at the same time. In this manner, the vapor-deposited substrate 4 is moved from the coating chamber 100 to the loading chamber 110-1, 110-2 and then the substrate 4 yet to be vapor-deposited is moved to the coating chamber 100.

It is more desirable to provide a door on the surface of the loading chambers 110-1, 110-2 each on the side opposite to the coating chamber 100 for the mounting, replacement, etc. of the substrate 4. The horizontal moving mechanism 20 for substrates may be configured so that the substrate support mechanism 10 can be moved past the reverse position to reach a position close to the door.

With this configuration, it is possible to provide vapor deposition device suitable for mass production with little variations in coating thickness on multiple substrates even if ceramic vapor deposition is to be conducted on multiple substrates by electron beam. According to the above aspect, electron-beam vapor deposition can be adopted since vapor deposition can be conducted with the substrates placed above the ceramic evaporation source. In addition, since the multiple substrates are rotated and revolved while being held by the left and right substrate support plates, coating thickness can be easily controlled to be uniform. Further, since the left and right sides can be changed in the loading chamber, the substrates as vapor deposition targets can be changed without devacuumization, which improves mass productivity.

The configuration of the device will be described in more detail.

[Placement and Temperature Control of Substrate, Control of Coating Thickness]

Figure 7:
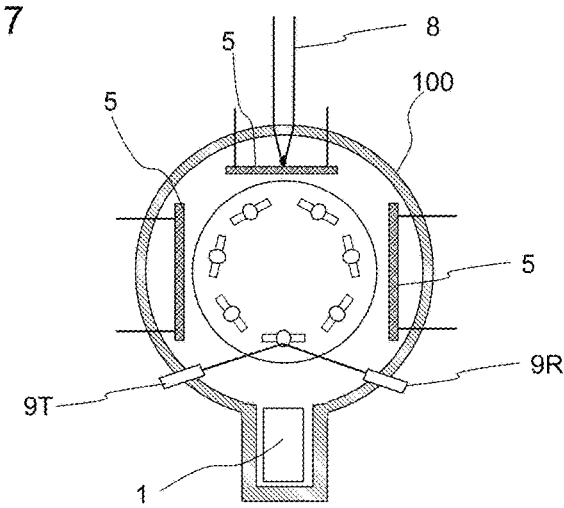
FIG. 7 is a side view illustrating a configuration example of a coating chamber.

FIG. 7 is a side view of the coating chamber illustrating a configuration example. The heater 5 may be provided not only on the upper side but on the front and back sides of the coating chamber 100 so as to surround multiple substrates 4 supported by the substrate support mechanism 10. It is more desirable to monitor substrate temperature and coating thickness during the vapor deposition process.

First, measurement of coating thickness will be described. For example, a coating thickness measurer 9 including an irradiator 9T that irradiates the substrate 4 with laser light from the wall surface of the coating chamber 100 and a light receiver 9R that receives light reflected on the substrate 4 is provided. The sample for measurement may be fixed to anything other than the substrate support mechanism 10 instead of the substrate 4. Coating thickness of the substrate 4 may be measured not during vapor deposition but in the loading chamber or outside.

Next, measurement and control of the substrate temperature will be described. For example, the thermocouple 8 is introduced from the upper side of the coating chamber 100 to measure the temperature of the heater 5. The correlation between the temperature of the substrate 4 and the temperature of the heater 5 is experimentally obtained in advance. Based on the correlation obtained in advance, a target temperature of the heater 5 for the desired temperature of the substrate 4 is specified, and electric power supplied to the heater 5 is controlled so that the temperature of the heater 5 becomes that desired temperature.

Figure 8:
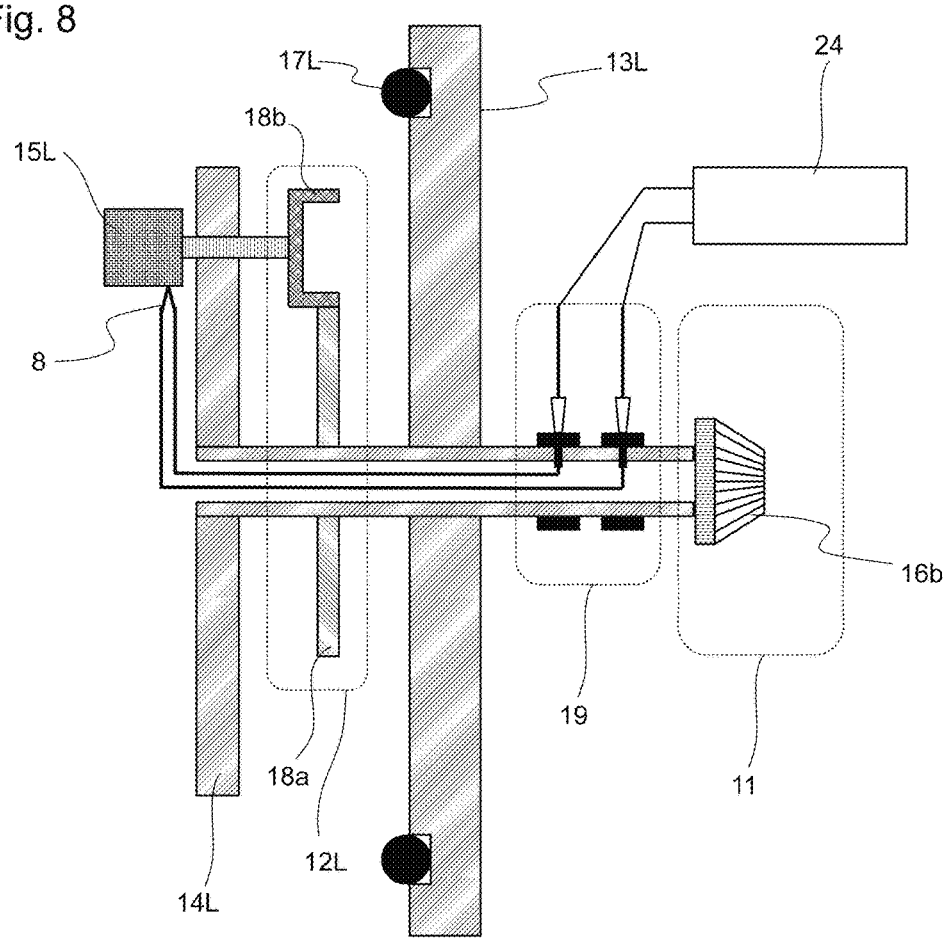
FIG. 8 is a cross-sectional view of the substrate support mechanism 10 with a thermocouple 8 attached to a substrate attaching portion 15.

Instead of or in addition to attaching to the heater 5, another thermocouple 8 for measuring temperature of the substrate support mechanism 10 at the portion near the substrate 4 may be provided. FIG. 8 is a cross-sectional view of the substrate support mechanism 10 in which the thermocouple 8 is attached to the substrate attaching portion 15. The bevel gear 16b of the rotational power transmission mechanism 11 for substrates penetrates the partition wall 13L and is connected to the gear 18a of the rotating/revolving mechanism 12L for substrates and the substrate support plate 14. The revolving shaft to be connected is vacuum-sealed at a position penetrating the partition wall 13L to be able to rotate by, for example, combining a Teflon packing and an O-ring. The revolution shaft is hollow. The thermocouple 8 is attached to the substrate holder 15, wired through the hollow revolution shaft via a rotary joint provided on the rotational power transmission mechanism 11 for substrates side, to reach the temperature measurer 24 outside of the loading chamber 110-1, 110-2. The thermocouple 8 may be attached to the substrate support plate 14. Alternatively, the temperature of the substrate 4 may be measured in a non-contact manner by using an infrared sensor (thermography) or the like.

FIG. 7 illustrates an example in which seven substrates 4 are mounted on the substrate support plate 14, where the number of substrates 4 to be mounted may be arbitrarily decided. In a case in which a large substrate 4 is used, even if the number of the substrate holders 15 on the substrate support plate 14 is fixed, substrates 4 may be mounted only on a part of the substrate holder 15 for vapor deposition. Alternatively, substrate support plates 14 with varied number of substrate holders 15 may be prepared for replacement.

Figure 9:
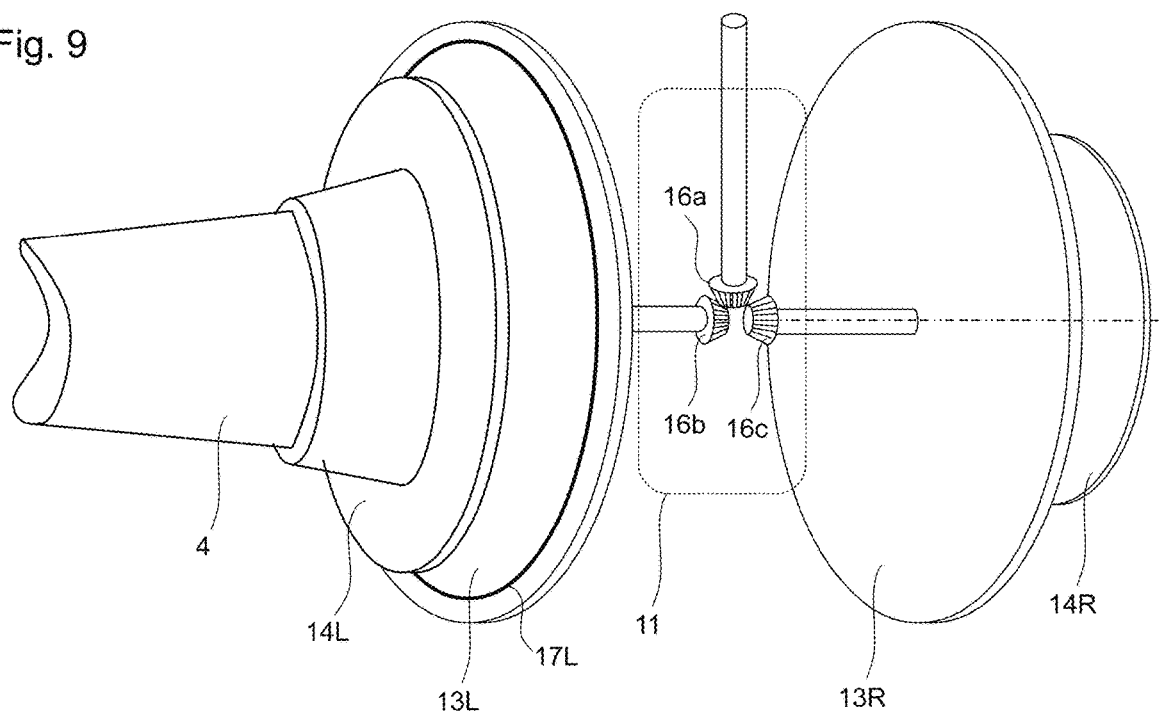
FIG. 9 is a perspective view schematically illustrating an example in which one substrate 4 is mounted on a substrate support plate 14.

FIG. 9 is a perspective view schematically illustrating an example in which one substrate 4 is mounted on the substrate support plate 14. The revolution of the substrate support plate 14 corresponds to the rotation of the substrate 4, and the rotating/revolving mechanism 12 for substrates may be omitted. Other configurations and operations are the same as those described with reference to FIG. 7, detailed description thereof will be omitted. This configuration is adopted when a large substrate 4, such as a gas turbine first stage rotor blade, is used.

Figure 10:
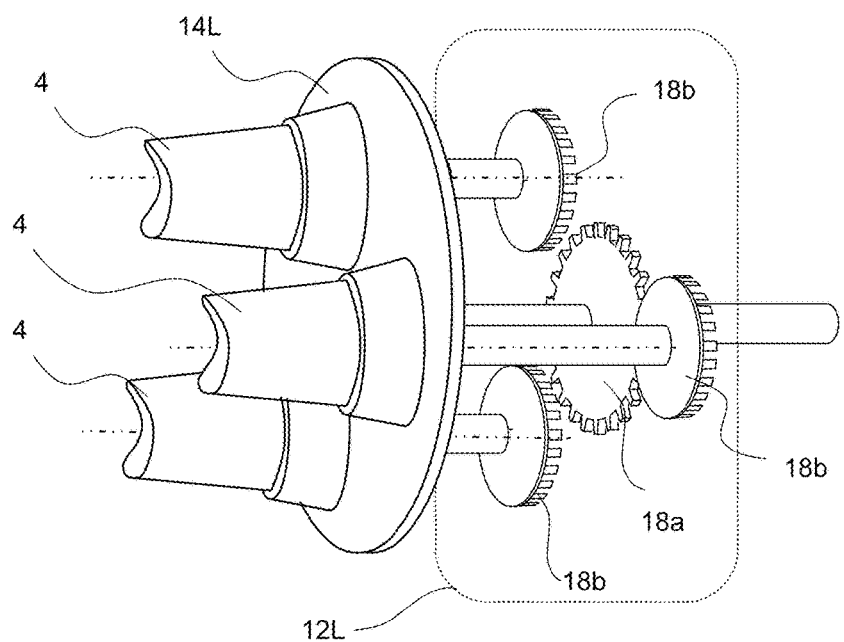
FIG. 10 is a perspective view schematically illustrating an example in which three substrates 4 are mounted on the substrate support plate 14.

FIG. 10 is a perspective view schematically illustrating an example in which three substrates 4 are mounted on the substrate support plate 14. The rotating/revolving mechanism 12 for substrates is configured by combining a gear 18a connected to the substrate support plate 14 to be revolved, and three gears 18b connected to three substrate holders 15 to be rotated. Other configurations and operations are the same as those described with reference to FIG. 7, detailed description thereof will be omitted. This configuration is adopted when a middle-sized substrate is used.

Configuration Example and Pretreatment of Loading Chamber

FIG. 11 is a side view illustrating a configuration example of the loading chamber 110. It is more desirable that a sputtering source 6 and a plasma cleaner 7 are provided in the loading chamber 110. Since the substrate support mechanism 10 is symmetrical, when the substrate 4 is rotated and revolved in the coating chamber 100, the substrate 4 can be rotated and revolved in the loading chamber 110 as well. In parallel with conducting vapor deposition in the coating chamber 100, cleaning and sputtering of the substrate 4 can be conducted in the loading chamber 110. Generally, when thermal barrier coating is applied to a metal, a bond layer is formed on a surface of the metal substrate, and then a ceramic coating for thermal barrier is coated. After cleaning the metal of the substrate 4 with the plasma cleaner 7, the material of the bond layer is deposited on the surface of the metal substrate 4 using the sputtering source 6, and then the substrate 4 is moved to the coating chamber 100 without devacuumization and then applied a thermal barrier coating. As the sputtering source 6, a magnetron sputtering source is suitably used, for example.

FIG. 12 is a time chart when a vapor deposition treatment in the coating chamber 100 is conducted immediately after a pretreatment in the loading chamber 110. The elapse of time is plotted on the horizontal axis, representing processing in each of the loading chamber 110 and the coating chamber 100. Before time t1, the substrates 4 are mounted on the substrate support mechanism 10 in the loading chamber 110. By reversing the substrate support mechanism 10 in the loading chamber 110, the substrates 4 are mounted on both sides of the substrate support mechanism 10. Next, the entire device is evacuated. After the evacuation is completed, the plasma cleaner 7 is operated from time t1 to time t2 to clean the substrate. Immediately thereafter, the sputtering source 6 is operated from time t2 to time t3 to deposit the bond layer on the surface of each substrate 4. Next, the substrate support mechanism 10 is returned to the loading chamber 110 and reversed, brought into close contact with the coating chamber 100, so that the substrates 4 with the bond layer formed thereon are loaded into the coating chamber 100. Here, the loading chamber 110 and the coating chamber 100 become unsealed, but both of them are still kept in a vacuum. Then, the loading chamber 110 and the coating chamber 100 are exhausted to a predetermined vacuum degree (e.g., 10-3 Pa, 10-5 Torr) and thermal barrier ceramic coating is vapor-deposited from time t4 to time t6 in the coating chamber 100. In parallel with the vapor deposition, in the loading chamber 110, the substrates are cleaned from time t4 to time t5, and the bond layer is deposited by sputtering from time t5 to time t6. Next, again, the substrate support mechanism 10 is returned to the loading chamber 110 and reversed, brought into close contact with the coating chamber 100, so that the substrates 4 with the bond layer formed thereon are sent to the coating chamber 100. Next, the loading chamber 110 and the coating chamber 100 are exhausted to a predetermined degree of vacuum, and thermal barrier ceramic coating is vapor-deposited from time t7 to time t8 in the coating chamber 100.

As described above, the cleaning of the substrates, the deposition of the bond layer, and the vapor deposition of the ceramic coating for thermal barrier can be conducted immediately one after another without devacuumization. Therefore, problems like contamination on interfaces can be minimized. Further, since cleaning, sputtering and vapor deposition can be conducted in parallel, the throughput can be increased, which contributes further improved mass productivity.

The above-described sequence of processes can be advanced by remote control or automatic operation after preparation is manually completed, introduction of cooling water is confirmed, and the main power is turned on. That is, the entire device including the coating chamber 100 and the loading chamber 110 is evacuated, the coating chamber 100 is baked, and the degree of vacuum in the background is confirmed to become equal to or less than a predetermined value. Then, oxygen is introduced into the oxygen plasma generator 2 to generate oxygen plasma, and the electron gun 31 is operated to conduct vapor deposition. Further, the coating thickness is measured while observing the state of the ingot, and the vapor deposition is completed when the coating thickness reaches a predetermined thickness. In parallel with these processes or as a preparatory step, the substrates may be subject to cleaning and sputtering to form a bond layer in the loading chamber 110.

[Continuous Supply of Ingots]

Although only one ingot, which is a ceramic raw material for vapor deposition, is illustrated in FIG. 2, it is more desirable to provide a mechanism capable of supplying ingots continuously.

FIG. 13 is a perspective view illustrating a configuration example of a continuous supply mechanism of ingots as ceramic raw materials. Four ingots 3-1 to 3-4 are arranged in a row on the ingot holding stage 50. The first ingot 3-1 is disposed at an electron-beam irradiation position from the electron gun 31. The ingots other than the first ingot 3-1 may desirably be arranged along guide plates, not illustrated, provided on both sides. The first ingot is removed by an ingot removal lever 52 after use. The ingots in a row are pushed by an ingot push lever 53, and the next ingot is moved to the first electron-beam irradiation position.

The ingot located at the electron-beam irradiation position can be moved vertically by an ingot control rod 51. As the ingot is consumed during the vapor deposition, the height of the portion irradiated with the electron beam and is melting is controlled constant. It is more desirable that the ingot control rod 51 is also rotatable and the ingot used is rotated with the rotation of the ingot control rod 51. As described above in the description of the evaporation source 1 with reference to FIG. 2, the following control is possible: positional unbalance of irradiation of the electron beam on the surface of the ingot is reduced so that the ingot is consumed uniformly.

FIG. 14 is an explanatory diagram illustrating removal of a used ingot from an electron-beam irradiation point in the continuous supply mechanism of FIG. 13. FIG. 15 is an explanatory diagram illustrating movement of an unused ingot to an electron-beam irradiation point in the continuous supply mechanism of FIG. 13. As illustrated in FIG. 14, by lowering the ingot control rod 51, the lower end of the used ingot 3-1 becomes the same height as that of the surface of the ingot holding stage 50, and by rotating the ingot removal lever 52, the ingot 3-1 can be removed from the electron-beam irradiation position. Then, as illustrated in FIG. 15, the ingots 3-2 to 3-4 arranged in a row are pushed by the ingot push lever 53, and the leading ingot 3-2 is moved to the electron-electron-beam irradiation position.

By providing the continuous supply mechanism of the ingots as described above, replacement of the ingots can be conducted during the vapor deposition. Therefore, even thick coating requiring multiple ingots can be conducted consecutively without devacuumization.

[Reuse of Ingots]

It is more desirable to improve the above-described mechanism capable of continuously supplying the ingots so that the used ingots can be reused.

FIGS. 16 to 19 each is a schematic perspective view illustrating a configuration example of an ingot supply mechanism capable of reusing a used ingot. Ingots need to be exhausted leaving some unused parts. This is because even if it is controlled by, for example, scanning the electron beam to be irradiated so that the evaporation is performed as uniformly as possible from the upper surface of the ingot, when the ingot is exhausted, the ingot control rod 51 will be exposed and irradiated with the electron beam. Then, a configuration in which a used ingot is placed on an unused ingot for reuse may be adopted.

Figure 16:
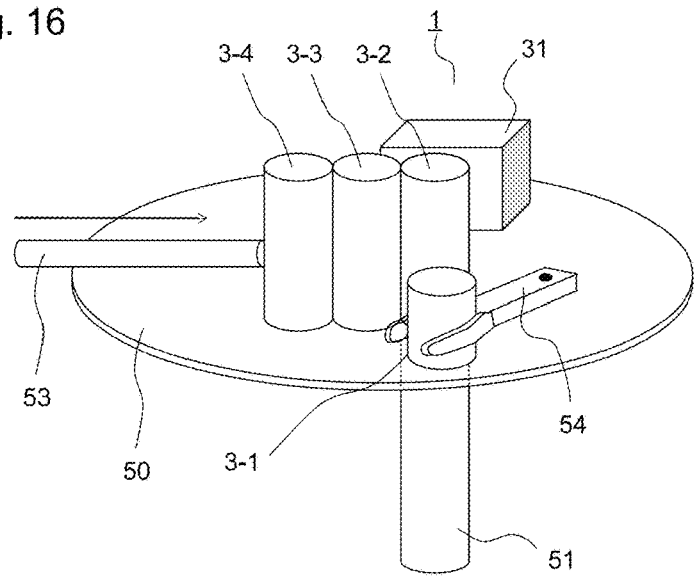
FIG. 16 is a schematic perspective view illustrating a configuration example of an ingot reuse mechanism (retraction of a used ingot).
Figure 17:
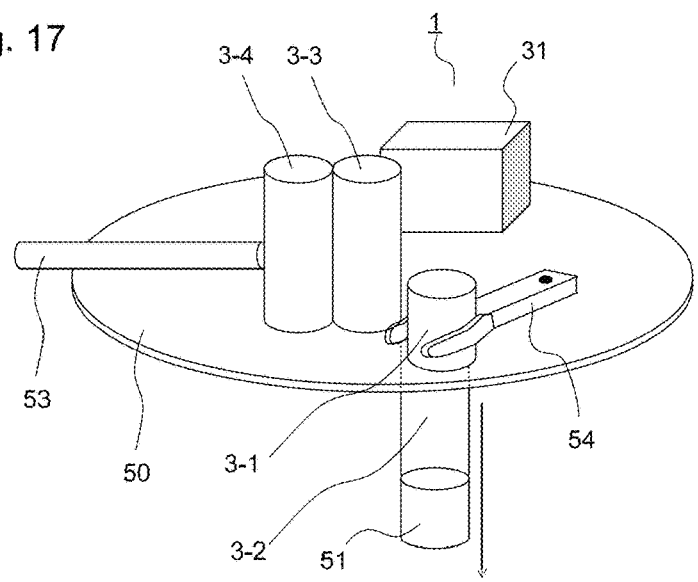
FIG. 17 is a schematic perspective view illustrating a configuration example of an ingot reuse mechanism (supply of an unused ingot).
Figure 18:
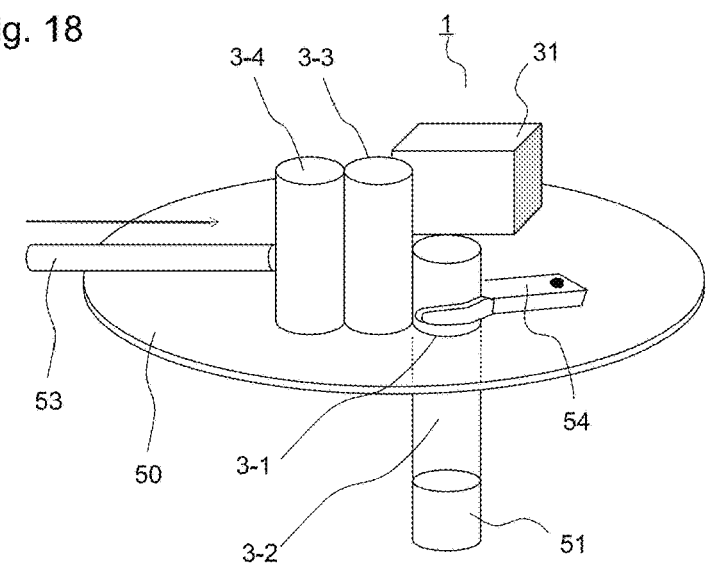
FIG. 18 is a schematic perspective view illustrating a configuration example of an ingot reuse mechanism (retraction of an unused ingot).
Figure 19:
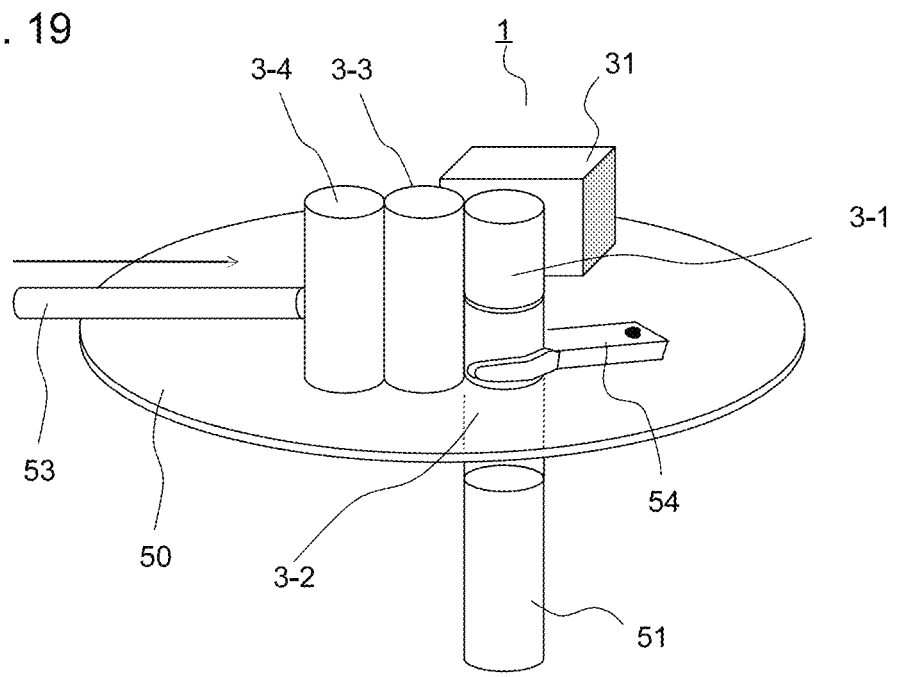
FIG. 19 is a schematic perspective view illustrating a configuration example of an ingot reuse mechanism (placement of a used ingot).

Instead of the ingot removal lever 52 of FIGS. 13 to 15, an ingot moving lever 54 is provided for returning the ingot to the original electron-beam irradiation position after temporarily retracting from the electron-beam irradiation position. The ingot moving lever 54 can be bifurcated, for example, as illustrated. As illustrated in FIG. 16, the used ingot 3-1 is temporarily retracted and then an unused ingot 3-2 to be used next is pushed into the electron-beam irradiation position by the ingot push lever 53. Next, as illustrated in FIG. 17, by lowering the ingot control rod 51, the upper surface of the unused ingot 3-2 is lowered to the same height as that of the surface of the ingot holding stage 50. Next, as illustrated in FIG. 18, the used ingot 3-1 that had been retracted is returned to the electron-beam irradiation position by the ingot moving lever 54. At the electron-beam irradiation position, the upper surface of the unused ingot 3-2 is at the same height as that of the surface of the ingot holding stage 50, so that the used ingot 3-1 is placed on the unused ingot 3-2. Next, as illustrated in FIG. 19, by lowering the ingot control rod 51, the used ingot 3-1 is lifted until the upper surface of the ingot 3-1 becomes the same height as that of the upper surface of the unused ingots 3-3 and 3-4. Then, the upper surface of the used ingot 3-1 is lifted to the position to be irradiated with the electron beam, which mean the used ingot 3-1 is used in the next vapor deposition. In the vapor deposition, the ceramic material is consumed gradually from the upper surface of the ingot 3-1 and the ingot control rod 51 is pushed up accordingly. The ingot control rod 51 pushes up the unused ingot 3-2 and thus pushes up the ingot 3-1 placed on the unused ingot 3-2. When the ingot 3-1 is exhausted, the unused ingot 3-2 below the ingot 3-1 is then irradiated with the electron beam for vapor deposition. In this manner, the once used ingot is reused.

The configuration example of the ingot supply mechanism in which a used ingot can be reused described here is merely an example, to which various changes can be made.

Second Embodiment

In the first embodiment, the vapor deposition device having two loading chambers 110-1 and 110-2 symmetrically located on both sides of the coating chamber 100 is described. However, the number of the loading chambers to be provided may be arbitrarily decided.

FIG. 20 is a configuration example of vapor deposition device provided with one loading chamber. A top view and a front view are given as in FIG. 1. Configuration and operation of the components are the same as those described in the first embodiment, so detailed description thereof will be omitted.

FIG. 21 is a configuration example of vapor deposition device provided with four loading chambers. Only the top view is given. Four loading chambers 110-1 to 110-4 are provided in four directions of one coating chambers 100. Each loading chamber includes a substrate support mechanism 10-1 to 10-4. Configuration and operation of each component are the same as those described in the first embodiment, so detailed description thereof will be omitted.

In an example in which one loading chamber is provided, a heater 5 for heating substrates can be disposed also on the right side surface, which facilitates easier temperature control of the substrates. On the other hand, by increasing the number of the loading chambers and the substrate support mechanisms, the number of substrates to be coated at a time can be increased, which may increase mass productivity.

While the invention made by the inventors has been particularly described with respect to the embodiments thereof, the invention is not limited thereto and other changes may be made therein without departing from the spirit and scope of the invention.

INDUSTRIAL APPLICABILITY

The invention is used suitably in vapor deposition device for forming ceramic coating on a surface of a metal substrate through vapor deposition.

EXPLANATION OF SIGN

1 Evaporation source (electron gun+ceramic ingot)
2 Plasma generator
3 Ceramic raw material (ingot)
4 Substrate
5 Heater for heating substrates
6 Sputtering source
7 Plasma cleaner
8 Thermocouple
9 Coating thickness measurer
9T Laser irradiator
9R Light receiver
10 Substrate support mechanism
11 Rotational power transmission mechanism for substrates
12 Rotating/revolving mechanism for substrates
13 Partition wall
14 Support plate
15 Substrate holder
16a, 16b, 16c Bevel gears
17 O-ring
18a, 18b Gears
19 Rotary joint
20 Horizontal moving mechanism for substrates
21 Horizontal movement driving mechanism for substrates
22 Reverse driving mechanism for substrates
23 Rotation/revolution driving mechanism for substrates
24 Temperature measurer
31 Electron gun
32 Scanning electrode
33 Power supply for generating thermion
34 Power supply for accelerating thermion
35 Power supply for scanning electron beam
40 Pedestal
41a, 41b Bevel gears
42 Guide rails
43 Screw rod
44 Fixing block
45 Moving block
50 Ingot holding stage
51 Ingot control rod
52 Ingot removal lever
53 Ingot push lever
54 Ingot moving lever
100 Coating chamber
110-1, 110-2 Loading chambers

The invention claimed is:

1. Vapor deposition device for forming a ceramic coating on a substrate, comprising a coating chamber, a loading chamber, and a substrate support, wherein:
   the coating chamber and the loading chamber are connected individually to a vacuumizer and are connected to each other at their opening in the left-right direction;
   inside the coating chamber are provided a raw material holder that supports a ceramic raw material and an electron gun that irradiates the ceramic raw material with an electron beam;
   the substrate support includes a left partition wall and a right partition wall, and also includes a left substrate support plate, multiple substrates being mountable thereon, to the left side of the left partition wall and a right substrate support plate, another set of multiple substrates being mountable thereon, to the right side of the right partition wall, the substrate support is configured to move horizontally in the left-right direction between a vapor deposition position at which one of the left and right partition walls is in close contact with the wall surface around the opening and a reverse position at which none of the left and right partition walls is in contact with the wall surface, is configured to rotate the left substrate support plate in a plane parallel to the left partition wall, is configured to rotate the mounted multiple substrates around a mounting portion, and is configured to rotate the right substrate support plate in a plane parallel to the right partition wall and
   the substrate support is further configured to reverse its position such that the other of the left and right partition walls is facing the opening.

2. The vapor deposition device according to claim 1, wherein the loading chamber further comprises at least one of a sputtering source, a cleaner, and an oxidizer.

3. The vapor deposition device according to claim 1, wherein the coating chamber further comprises an oxygen plasma generator.

4. The vapor deposition device according to claim 1, wherein the coating chamber further comprises a scanning mechanism for scanning a position where the ceramic raw material held in the raw material holder is irradiated with the electron beam.

5. The vapor deposition device according to claim 1, wherein the substrate support comprises gears that define a ratio between rotation speeds of the left and right substrate support plates and rotation speeds of the multiple substrates.

6. The vapor deposition device according to claim 1, wherein the raw material holder is capable of holding multiple ceramic ingots as the ceramic material and includes a mechanism for sequentially moving the multiple ceramic ingots to the position to be irradiated with the electron beam.

7. The vapor deposition device according to claim 1, wherein multiple sets of the loading chambers, and the substrate supports are provided at symmetrical positions about the coating chamber.

* * * * *